United States Patent [19]

Lynch et al.

[11] Patent Number: 4,550,072

[45] Date of Patent: Oct. 29, 1985

[54] PHOTOSENSITIVE RECORDING MATERIALS CONTAINING PARTICLES FOR THE PRODUCTION OF ABRASION-RESISTANT GRAVURE PRINTING PLATES, AND THE PRODUCTION OF GRAVURE PRINTING PLATES USING THESE RECORDING MATERIALS

[75] Inventors: John Lynch, Monsheim; Albert Elzer, Otterstadt, both of Fed. Rep. of Germany

[73] Assignee: BASF Aktiengesellschaft, Fed. Rep. of Germany

[21] Appl. No.: 656,427

[22] Filed: Oct. 2, 1984

Related U.S. Application Data

[60] Continuation of Ser. No. 513,831, Jul. 14, 1983, abandoned, which is a division of Ser. No. 400,136, Jul. 20, 1982, abandoned.

[51] Int. Cl.[4] .......................... G03C 1/68; G03C 1/71; G03F 7/10
[52] U.S. Cl. .................... 430/256; 430/307; 430/328
[58] Field of Search ............. 430/270, 273, 307, 950, 430/961, 272, 256, 328

[56] References Cited

U.S. PATENT DOCUMENTS

| 2,892,712 | 6/1959 | Plambeck | 430/270 |
|---|---|---|---|
| 3,770,435 | 11/1973 | Volkert et al. | 430/307 |
| 3,782,939 | 1/1974 | Bonham et al. | 430/307 |
| 4,275,143 | 6/1981 | Sakurai | 430/307 |
| 4,345,022 | 8/1982 | Kress | 430/307 |

FOREIGN PATENT DOCUMENTS

| 59417 | 6/1980 | Australia . |
| 41361 | 10/1972 | Japan . |
| 803523 | 6/1980 | South Africa . |
| 1367921 | 9/1974 | United Kingdom . |
| 1544748 | 4/1979 | United Kingdom . |

*Primary Examiner*—Richard L. Schilling
*Attorney, Agent, or Firm*—Keil & Weinkauf

[57] ABSTRACT

Gravure printing plates which are highly abrasion-resistant and scratch-resistant can be produced rapidly and simply from a photosensitive recording material by exposing the latter through a photographic positive, washing out the unexposed areas and drying the resulting gravure printing plate, if the photosensitive recording material employed, which comprises a photopolymerizable and/or photocrosslinkable layer (L) applied to a dimensionally stable base, contains finely divided, hard, abrasive particles in the layer (L), the surface of this layer, which subsequently constitutes the surface of the printing plate, has a peak-to-valley height of <2 µm, and the materials of this layer are chosen so that, after exposure and development, it has a Vickers hardness of not less than 10 N/mm², measured under load.

11 Claims, No Drawings

PHOTOSENSITIVE RECORDING MATERIALS CONTAINING PARTICLES FOR THE PRODUCTION OF ABRASION-RESISTANT GRAVURE PRINTING PLATES, AND THE PRODUCTION OF GRAVURE PRINTING PLATES USING THESE RECORDING MATERIALS

This application is a continuation of application Ser. No. 513,831, filed on July 14, 1983 which is a Divisional Application of Ser. No. 400,136, filed July 10, 1982, both now abandoned.

The present invention relates to photosensitive recording materials which comprises a photopolymerizable and/or photocrosslinkable layer and are suitable for the production of gravure printing plates which are highly abrasion-resistant and scratch-resistant, and the production of such gravure printing plates using these recording materials.

The gravure printing plates in current use are in general those in which the steel supporting cylinder is surrounded by a copper jacket which forms the base for the Ballard skin, which is the actual printing layer. This Ballard skin is a chromium-plated copper layer in which the depressions (wells) required to take up the ink are located. In the printing process, the printing plate is first inked, and then moves past a steel doctor blade which removes ink from the surface of the plate but leaves the wells filled with ink. The printing plate then runs over the material to be printed, an impression roller being used, and the ink is transferred from the wells.

The number of printed copies obtainable in this conventional gravure printing process is limited in general by the slow uniform abrasion of the chromium layer of the Ballard skin or by the destruction of this chromium layer as a result of fine flakes of material breaking off, and is on average about 500,000–5,000,000. Gravure printing thus combines long printing life with very good printing quality and makes it possible to obtain, in particular, substantially better continuous-tone reproduction in comparison with other printing processes. Owing to the very complicated and expensive production of the printing plate application of a copper layer to the copper-jacketed steel supporting cylinder by electrocoating, mechanical engraving or etching of the copper layer, and chromium-plating of the engraved or etched copper layer, gravure printing has hitherto been limited to those applications which require a high printing quality and a long press run. It is desirable to develop the conventional gravure printing process so that it can be employed in an economical manner for a wider and more varied range of tasks.

For this purpose, German Laid-Open Application DOS No. 2,752,500 recommends the use of a gravure printing plate which possesses a plastic printing layer and is produced by coating the printing plate base with a plastic and engraving mechanically, in the plastic layer, the depressions which take up the ink. To improve the engraving characteristics, the plastic layer may contain an inorganic filler in powder form, having a particle size of from 0.01 to 10 μm. To avoid the occurrence of scratches and grooves on the surface of this plate, the conventional steel doctor blades should, as stated in German Laid-Open Application DOS No. 2,752,500, be replaced by plastic doctor blades in the gravure printing process. The number of copies thus obtainable, which is about 50,000, is still unsatisfactory, and these plates are also expensive to produce, owing to the face that the plastic printing surface has to be engraved mechanically.

Furthermore, it is known that a gravure printing plate possessing a plastic printing layer may be produced using photopolymerizable materials to form this layer. In this procedure, the depressions which take up the ink and are located in the surface of the printing layer are produced, in a manner similar to that employed in the production of letterpress and flexographic printing plates, by imagewise exposure of the photopolymerizable layer and subsequent washing out of the unexposed areas. Processes for the production of gravure printing plates based on photopolymerizable systems are described in, inter alia, German Laid-Open Applications DOS Nos. 2,054,833 and 2,061,287 and in Japanese Pat. No. 41,361/72. Gravure printing plates of this type are in general based on photopolymerizable systems which are the same as or similar to those employed for the production of photopolymer letterpress plates.

Although gravure printing plates may be produced in a comparatively rapid, simple, versatile and economical manner using photopolymerizable systems, the resulting plates have hitherto proven insufficiently abrasion-resistant and scratch-resistant in field tests. The steel doctor blades conventionally used in gravure printing slide into the working position set in the printing press, not without damage to the plastic printing layer. Moreover, owing to the formation of sharp edges, holes, points, etc., they frequently scratch the plastic printing layer and produce a high degree of abrasion of this layer. Substantially better results are not achieved even when the plastic doctor blades described in German Laid-Open Application DOS No. 2,752,500 are used, since the substantially higher contact forces and contact pressures required for the necessarily thick plastic doctor blades cause extensive wear. With these gravure printing plates, also, it is possible to obtain a run of no more than about 50,000 high-quality printed copies.

It has also been disclosed that finely divided mineral fillers may be added to the polymerizable layer of a recording material employed in the production of letterpress printing plates, photoresists, relief images or offset plates. These additives either serve simply as fillers or are employed predominantly to achieve a roughened matt surface (cf., inter alia, German Laid-Open Applications DOS Nos. 2,403,487 and 2,926,236). U.S. Pat. No. 3,782,939 discloses that inorganic substances may be added to positive-working photosensitive elements suitable for the production of photoresists, in order to improve the mechanical properties, for example the abrasion-resistance; surface roughness, however, is of no importance in photoresist materials. In contrast, the surface of a gravure printing plate must satisfy high requirements not only in respect of its abrasion-resistance, but in particular of its smoothness, evenness and freedom from grooves, and for this reason the addition of finely divided mineral fillers to photopolymerizable recording materials used for producing gravure printing plates has hitherto been considered unsuitable and disadvantageous.

It is an object of the present invention to improve the gravure printing process using a plastic printing layer, and thereby substantially avoid the above disadvantages and obtain a substantially longer press run than hitherto, without having to accept poorer printing quality in return. In particular, it is an object of the present invention to provide a simple method for producing gravure printing plates which are based on photo-polymer systems, possess good abrasion-resistance and scratch-resistance coupled with very good printing properties, and, without entailing any disadvantage, are suitable for use with the steel doctor blades usually employed for conventional gravure printing.

We have found, surprisingly, that this object is achieved when a photosensitive recording material which contains finely divided, hard, abrasive particles in the photopolymerizable and/or photocrosslinkable layer subsequently forming the printing layer is used for the production of the gravure printing plate containing a plastic printing layer, the surface of the photopolymerizable and/or photocrosslinkable layer has a peak-to-valley height of <2 μm, and the recording material, after exposure and development, has a Vickers hardness of not less than 10 N/mm², measured under load.

Accordingly, the present invention relates to a photosensitive recording material for the production of gravure printing plates, which comprises a layer (L) which is applied to a dimensionally stable base and contains a photopolymerizable and/or photocrosslinkable material which is preferably solid, is soluble or dispersible in a developer, and becomes insoluble or non-dispersible therein when exposed to actinic light. The photosensitive recording material according to the invention, contains, at least to a depth of from 1–50 μm, measured from the surface of the layer (L), finely divided, abrasive particles in an amount of from 2 to 50% by weight, based on the photopolymerizable and/or photocrosslinkable material, the mean prticle size being from 0.1 to 6 μm, not more than 5% of the abrasive particles have a maximum particle size greater than 10 μm, the particles have a hardness of >4.0 Mohs' hardness scale, the surface of the layer (L), which subsequently constitutes the surface of the printing plate, has a peak-to-valley height of less than 2 μm, and the layer (L), after exposure, development, drying and, if required, after-exposure and/or hardening, has a Vickers hardness of not less than 10 N/mm², measured under load, at least to the depth of the wells which take up the ink.

The present invention furthermore relates to processes for the production of gravure printing plates using these photosensitive recording materials, and to specific forms of the photosensitive recording materials and of the processes for the production of the gravure printing plates, as described in detail below.

It was very surprising that the above photosensitive recording materials can be used to prepare gravure printing plates having abrasion-resistance and scratch-resistance comparable to those of the chromium-plated Ballard skins, and that these plates also possess surfaces which are sufficiently smooth to permit them to be used, without disadvantages and loss of quality, for quality gravure printing. It was to be assumed, rather, that the abrasive particles present in the photopolymerizable and/or photocrosslinkable layer (L) would lead to such roughness on the surface of the printing plate when the recording materials, after exposure through an image-bearing transparency, were developed with the developer that these plates would be unsuitable for gravure printing. Moreover, it was very surprising that, when the novel plates were used for gravure printing, the conventional steel doctor blades could be employed, and they would by uniformly worn away be the surface of the printing plate, without scratches or grooves being produced in, or other damage being caused to, the doctor blade or the plastic printing layer by the sharp edges, points, etc., of the abrasive particles.

It is thus possible to produce gravure printing plates, in accordance with the invention, in a simple, rapid and economical manner, the quality of which plates substantially corresponds to that of a conventional gravure printing plate with a Ballard skin.

For the purposes of the invention, gravure printing plates are understood as meaning printing plates, printing films or printing cylinders whose image-forming portions carrying the printing ink are in the form of wells in the surface. In the novel gravure printing plate, thee wells are located in the photopolymer printing layer which is firmly applied to a printing plate base which is conventionally of metal, for example a steel plate or cylinder. The photopolymeric plastic printing layer, and hence the photopolymerizable and/or photocrosslinkable layer (L) of the photosensitive recording material, is in general from 30 to 500, preferably from 50 to 250, μm thick. The shallowest wells, ie. the depressions which take up the ink, are normally a few μm, eg. from 2 to 3 μm, deep, and the deepest wells are not more than about 10–100, preferably about 20–60, μm deep.

Photosensitive materials which are suitable for the layer (L) of the recording material, and which are soluble or dispersible in a developer and become insoluble or non-dispersible therein when exposed to actinic light, are the conventional photopolymerizable and/or photocrosslinkable systems based on compounds having one or more photopolymerizable or photocrosslinkable double bonds. These materials become insoluble in the developer as a result of a radiation-initiated polymerization or crosslinking of the unsaturated compounds.

Examples of photopolymerizable and/or photocrosslinkable materials suitable for the purpose of the invention include mixtures containing photopolymerization initiators, where a constituent of the mixture is a low moleculr weight, olefinically unsaturated, photopolymerizable compound. Polymers which contain a sufficient proportion of olefinic photopolymerizable double bonds may also be employed, together with one or more photopolymerization initiators, even without the addition of low molecular weight, photopolymerizable compounds. Preferably, the photopolymrizable and/or photocrosslinkable material of the layer (L) of the photosensitive recording material essentially comprises one or more saturated and/or unsaturated polymers, one or more low molecular weight, olefinically unsaturated, photopolymerizable compounds and one or more photopolymerization initiators, with or without further additives and/or assistants.

Suitable polymers, in general the basic component, for the photopolymerizable and/or photocrosslinkable materials are the synthetic polymers which are soluble in developers, and are conventionally employed for the production of photopolymerizable layers, in particular of relief plates for printing purposes. Examples include vinyl polymers, eg. polyvinyl chloride, vinylidene chloride polymers, and copolymers of vinyl chloride and vinyl esters of monocarboxylic acids of 2 to 11 carbon atoms, with or without vinyl alcohol, and polymers containing predominant amounts of olefinically unsaturated carboxylic acids of 3 to 5 carbon atoms and/or their esters and/or their amides, for example polymers of acrylic acid, methacrylic acid, acrylamide, methacrylamide, acrylates and methacrylates of alkanols of 1 to 12 carbon atoms, aliphatic diols and polyols, eg. ethylene glycol, butane-1,4-diol and glycerol. Other suitable polymers are those based on styrene or on vinyl esters of monocarboxylic acids of 2 to 11 carbon atoms, eg. vinyl acetate and vinyl chloroacetate, and polyformaldehyde, polyimides and poly(amide-imides), polyurethanes, polyetherurethanes, polyester-urethanes, preferably containfing urea groups, melamine/formaldehyde resins and phenol/formaldehyde resins, and, in particular, the conentional unsaturated polyester resins of polybasic, in particular dibasic, carboxylic acids and polyhydric, in particular dihydric, alcohols. Examples of suitable unsaturated polyesters are those the acid component of which is derived from maleic acid, fumaric acid, itaconic acid, citraconic acid or measaonic acid, or from another unsaturated and/or saturated polybasic carboxylic acid, and the alcohol component of which is derived, for example, from an alkanediol, eg. ethylene glycol, propane-1,2-diol, propane-1,3-diol, butylene-1,3-glycol, butane-1,4-diol, hexane-1,6-diol, diethylene glycol, triethylene glycol, tetraethylene glycol or neopentylglycol.

Advantageous basic components for the photopolymerizable and/or photocrosslinkable materials are, in particular, vinyl alcohol polymers containing $CH_2CH(OH)$ structural units in the polymer main chain, and their copolymers and derivatives which are soluble or dispersible in water or aqueous developers, eg. esters, ethers or acetals. Particularly suitable components are the conventional hydrolyzed polyvinyl esters of aliphatic monocarboxylic acids of 1 to 4 carbon atoms, eg. polyvinyl acetates and polyvinyl propionates having an average degree of polymerization of from 200 to 3,000, in particular from 250 to 750, and a degree of hydrolysis of from 65 to about 100, in particular from 80 to 88, mole %. It is also possible to employ mixtures of hydrolyzed vinyl ester polymers or vinyl ester copolymers having different degrees of polymerization and/or of hydrolysis. Further suitable compounds in this connection are the reaction products of vinyl alcohol polymers with acrylic anhydride and/or methacrylic anhydride, these products containing in general from 3 to 30% by weight, based on the product, of acryloyl or methacryloyl groups; and also the water-soluble reaction products of vinyl alcohol polymers with ethylene oxide, the proportion of ethylene oxide units in the ethaoxylated vinyl alcohol polymer being from 5 to 75, in particular from 10 to 60, % by weight. These reaction products of vinyl alcohol polymers may constitute the only polymer component in the photopolymerizable and/or photocrosslinkable materials, or may be present as a mixture with other vinyl alchol polymers, in particular the above hydrolyzed polyvinyl esters, the proportion of the reaction products of the polyvinyl alcohol advantageously being not less than 30% by weight, based on the total vinyl alcohol polymers present in the mixture. It is furthermore possible for the above vinyl alcohol polymers or vinyl alcohol copolymers and/or their derivatives to be mixed with not more than about 30% by weight, based on the amount of polymers in the particular photopolymerizable and/or photocrosslinkable material, of compatible melamine/formaldehyde resins, urea/formaldehyde resins or phenol/formaldehyde resins.

Other particularly suitable polymers for the photopolymerizable and/or photocrosslinkable materials are the linear synthetic nylons which are soluble in conventional organic and, in particular, alcoholic solvents (developers) and contain repeating amide groups in the main chain of the molecule. Preferred compounds of this type are the nylon copolymers which are soluble in conventional solvents or solvent mixtures, in particular lower aliphatic alcohols, eg. ethanol and n-propanol, or mixtures of these alcohols with water, examples being nylon copolymers prepared in a conventional manner by polycondensation or polymerization of two or more lactams having from 5 to 13 ring members. Examples of such lactams are pyrrolidone, caprolactam, oenantholactam and laurolactam, and the corresponding C-substituted lactams, eg. ε-methyl-ε-caprilactam, ε-ethyl-ε-caprolactam and ε-ethylenantho-lactam. Instead of the lactams, the aminocarboxylic acids on which they are based may be subjected to polycondensation. Further suitable nylon copolymers are polycondenstates of diamine/dicarboxylic acid salts, which have been prepared from three or more nylon-forming starting materials. Preferred dicarboxylic acids and diamines for this purpose are aliphatic dicarboxylic acids of 4 to 20 carbon atoms, eg. adipic acid, suberic acid, sebacic acid and dodecanedicarboxylic acid, and appropriate substitution products, eg. α,α-diethyladipic acid, α-ethylsuberic acid, heptadecane-1,8-dicarboxylic acid and heptadecane-1,9-dicarboxylic acid, and their mixtures, as well as dicarboxylic acids containing aliphatic or aromatic ring systems. Suitable dimines are, in particular, aliphatic or cycloaliphtic diamines containing two primary and/or secondary amino groups, in particular of 4 to 20 carbon atoms, eg. pentamentylenediamine, hexamethylenediamine, heptamethylenediamine and octamethylenediamine, and C-substituted and/or N-substituted derivatives of these amines, eg. N-methyl-N'-ethylhexamethylenediamine, 1,6-diamino-4-methylhexane, 4,4'-diaminodicyclohexylmethane and 2,2-(4,4'-diaminodicyclohexy)-propane, and aromatic diamines, eg. m-phenylenediamine, m-xylylenediamine and 4,4'-diaminodiphenylmethane, and in all the starting materials the bridge members between the two carboxylic acid groups or amino groups may also be interrupted by hetero-atoms, eg. oxygen, nitrogen or sulfur. Particularly suitable nylon copolymers are those prepared by co-condensation of a mixture of one or more lactams, in particular caprolactam, with one or more dicarboxylic acid/diamine salts, eg. from ε-caprolactam, hexamethylenediammonium adipate and the salt of 4,4'-diaminodicylohexylmethane with adipic acid.

Suitable low molecular weight, olefinically unsaturated, photopolymerizable compounds are the conventional monomers and oligomers which have molecular weights of less than 2,000 and are known per se for photopolymerizable and/or photocrosslinkable materials containing polymeric binders, the type and amount of these compounds depending, of course, on the particular polymeric binder, with which they should be compatible. It is preferable to employ low molecular weight, photopolymerizable compounds containing two or more ethylenically unsaturated, photopolymerizable double bonds, either alone or in the form of mixtures with monomers containing only one olefinically unsaturated, photopolymerizable double bond, the proportion of monomers containing only one double bond being in general about 5–50, preferably 5–30, % by weight of the total amount of monomers. Under certain preconditions, it is of course also possible to employ, as the photopolymerizable, low molecular weight compounds, predominantly or only those which contain only one photopolymerizable double bond in the molecule, particularly when the polymer present in the photopolymerizable and/or photocrosslinkable material itself has a high proportion of photopolymerizable double bonds, as, for example, in the case of the acrylated and/or methacrylated vinyl alcohol polymers. In general, the low molecular weight, photopolymrizable compounds have boiling points of about 100° C. under atmospheric pressure.

Examples of low molecular weight, olefinically unsaturated, photopolymrizable compounds are mono-, di- and polyacrylates and the corresponding methacrylates, as obtained by esterification of acrylic acid or methacrylic acid with monohydric or polyhydric, low molecular weight alcohols. These compounds include, inter alia, the diacrylates, triacrylates, dimethacrylates and trimethacrylates of ethylene glycol, diethylene glycol, triethylene glycol, polyethylene glycols with molecular weights of not more than about 500, propane-1,2-diol, propane-1,3-diol, polypropylene glycols with molecular weights of not more than about 500, neopentylglycol (2,2-dimethylpropanediol), butane-1,4-diol, 1,1,1-trimethylolpropane, glycerol and pentaertythritol, and the monoacrylates and monomethacrylates of such diols and polyols, eg. ethylene glycol monoacrylate, ethylene glycol monomethacrylate, propane-1,2-diol monoacrylate, propane-1,2-diol monomethacrylate, propane-1,3-diol monoacrylate and propane-1,3-diol monomethacrylate, and the monoacrylates and monomethacrylates of di-, tri- and tetraethylene glycol. Further suitable low molecular weight, olefinically unsaturated, photopolymerizable compounds are those containing urethane groups and/or amide goups, for example the compounds prepared from aliphatic diols of the above type, organic diisocyantes, eg. hexamethylene diisocyante, toluylene diisocyanate and isophorone diisocyanate, and hydroxyalkylacrylates and -methacrylates of the above type. Other examples include acrylic acid itself, methacrylic acid itself, acrylates and methacrylates of monoalkanols of 1 to 6 carbon atoms, monoacrylamides, monomethacrylamides, bis-acrylamides and bis-methacrylamides of aliphatic or aromatic diamines of 2 to 8 carbon atoms, eg. of ethylenediamine, propylenediamine, butylenediamine, pentamethylenediamine, hexamethylenediamine, octamethylenediamine and xylylenediamine, as well as derivatives of acrylamide and methacrylamide, eg. N-hydroxymethylacrylamide and N-hydroxymethylmethacrylamide, and in particular the reaction products of 2 moles of N-hydroxymethylacrylamide or -methacrylamide with one mole of an aliphatic diol, eg. ethylene glycol or propylene glycol.

The choice of suitable monomers depends on the polymers present in the photopolymerizable and/or photo-crosslinkable material and on the properties desired in the end product, and is readily made by a skilled worker. Thus, the above di- and polyacrylates and/or -methacrylates are particularly suitable, for example, for photopolymerizable and/or photocrosslinkage materials based on polyester resins, in particular materials containing unsaturated polyester resins. In addition to these acrylates and methacrylates, it is also possible to employ allyl compounds eg. diallyl maleate, allyl acrylate, diallyl phthalate, diallyl trimellitate and triallyl trimellitate. If vinyl alcohol polymers are employed as polymeric binders in the photopolymerizable and/or photocrosslinkable materials, particularly suitable monomers are the water-soluble monomers, eg. hydroxyalkyl acrylates, hydroxyalkyl methacrylates, and monoacrylates, diacrylates, monomethacrylates and dimethacrylates of polyethylene glycols, and mixtures of these with diacrylates, polyacrylates, dimethacrylates or polymethacrylates of the above type. If the photopolymerizable and/or photocrosslinkable materials chosen contain nylons as the polymeric binders, particularly suitable monomers of the above type are the diacrylates, polyacrylates, dimethacrylates and polymethacrylates, monomers containing amide and/or urethane groups in addition to the double bonds, acrylamides and methacrylamides, and, in particular, the derivatives of acrylamides and of methacrylamides.

The polymers and the low molecular weight, olefinically unsaturated, photopolymerizable compounds are present in the photopolymerizable and/or photocrosslinkable materials in general in amounts of from about 50 to 90% by weight and from 10 to 50% by weight respectively, based on the sum of the polymers and low molecular weight, photopoiymerizable compounds in each case. The amount of low molecular weight, photopolymerizable compounds can be varied in individual cases, and may, for example, be below 10% by weight; these compounds may even be entirely absent when the photopolymerizable and/or photocrosslinkable materials contain unsaturated polymers having a sufficiently high content of photopolymerizable double bonds.

Suitable photopolymerization initiators, which are present in the photopolymerizable and/or photocrosslinkable materials in general in an amount of from 0.05 to 10, in particular from 0.5 to 5, % by weight, based on the total photopolymerizable and/or photocrosslinkable material, are the conventional photopolymerization initiators and systems which are used for initiating photopolymerization under irradiation with actinic light, such photoinitiators being adequately described in the relevant literature. Examples of photoinitiators are acyloins and their derivatives, such as benzoin, benzoin alkyl ethers, eg. benzoin methyl ether and benzoin isopropyl ether, α-methylolbenzoin and its ethers and α-methylbenzoin and its ethers, 1,2-diketones and their derivatives, such as diacetyl, benzyl, benzyl ketals, eg. benzyl dimethyl ketal, benzyl methyl ethyl ketal, benzyl methyl benzyl ketal and benzyl ethylene glycol monoketal, acylphosphine oxide compounds, in particular acyldiarylphosphine oxides and specifically acyldiphenylphosphine oxides whose acyl radicals are derived from a tertiary aliphatic or cycloaliphatic carboxylic acid or from a benzoic acid which is substituted at least in the 2,6 positions, such compounds being described in detail in German Laid-Open Application DOS No. 2,909,992.

The photopolymerization initiators can be used individually or as mixtures with activators, eg. tertiary amines, and it is advantageous to employ very active photopolymerization initiators. Surprisingly, we have found that gravure printing plates with particularly smooth surfaces are obtained when the photopolymerizable and/or photocrosslinkable materials contain, in addition to photoinitiators which have a low absorption in the actinic wavelength range, in particular from 300 to 380 nm, and preferably have an extinction coefficient $\epsilon$ of $<350$ cm$^2$/millimole at 360 nm, e.g. the above benzoins, benzoin ethers, benzil or benzil monoketals, photoinitiators having extinction coefficients $\epsilon$ of $>500$ cm$^2$/millimole, in particular $>5,000$ cm$^2$/millimole, at 360 nm. Examples of such strongly absorbing coinitiators are 4,4'-bis-(N-dimethylamino)-benzophenone (Michler's ketone) and derivatives of Michler's ketone, for example the 4,4'-bis-(N-hydroxyalkyl-N-alkylamino)-benzophenones described in European Published Application A1-0,000,342, e.g. 4,4'-bis-(N-β-hydroxyethyl-N-methylamino)-benzophenone, 4'4-bis-(N-β-hydroxyethyl-N-ethylamino)-benzophenone, 4,4′-bis-(N-β-hydroxyethyl-N-propylamino)-benzophenone, 4,4′-bis-(N-β-hydroxypropyl-N-methylamino)-benzophenone and 4,4′-bis-(N-hydroxypropyl-N-ethylamino)-benzophenone. For the advantageous initiator combination of strongly absorbing and weakly absorbing initiators, the molar ratios and amounts known for Michler's ketone can be employed. Conventionally, the strongly absorbing initiators are present in the photopolymerizable and/or photocrosslinkable materials in an amount of from 0.05 to 0.4, preferably from 0.1 to 0.25, % by weight, depending on the thickness of the initiator-containing layer, and the ratio of the strongly absorbing initiator to the weakly absorbing co-initiator depends on the exposure characteristics desired, and can be, for example, about 1:10.

It is often advantageous to add other conventional assistants and additives to the photopolymerizable and/or photocrosslinkable materials, and these include, in particular, thermal polymerization inhibitors, eg. hydroquinone, p-methoxyphenol, m-dinitrobenzene, p-quinone, methylene blue, β-naphthol, N-nitrosamines, eg. N-nitrosodiphenylamine, and salts, in particular the alkali metal and aluminum salts, of N-nitrosocyclohexylhydroxylamine. These inhibitors are used in general in amounts of from 0.01 to 2.0% by weight, based on the total photopolymerizable and/or photocrosslinkable material. The materials can moreover contain, for example, plasticizers, dyes, pigments, etc., as further additives.

An essential feature of the present invention is the presence of finely-divided, hard, abrasive particles in the photopolymerizable and/or photocrosslinkable layer (L) of the photosensitive recording materials for the production of the gravure printing plates. The abrasive particles should be dense, have in general an irregular shape, and advantageously possess sharp edges, corners or points. They should have a mean particle size of from 0.1 to 6 μm, and not more than 5%, preferably less than 1%, of these particles may have a maximum particle size greater than 10 μm. The mean particle size may be determined by conventional methods, in particular sedimentation analysis. The maximum particle size may be determined, for example, by the conventional microscopic methods of measurement.

If the photopolymerizable and/or photocrosslinkable layer (L) of the photosensitive recording material contains a substantial amount of abrasive particles with a maximum particle size greater than 10 μm, it is generally no longer possible, without other, additional measures, to use the photosensitive recording material to produce gravure printing plates having the low degree of surface roughness required. If the abrasive particles are excessively finely divided, ie. if substantial amounts of the abrasive particles added possess particle sizes <0.01 μm, the printing surface of the corresponding gravure printing plate does not possess optimum abrasion-resistance and scratch-resistance. The hardness of the abrasive particles should be >4.0, advantageously 6 or more, on Mohs' hardness scale. Suitable abrasive particles for the purpose of the invention are, in particular, mineral fillers and pigments, eg. silicon dioxides, in particular quartz powder and cristobalite, silicates, in particular aluminum silicates and silicate glasses, aluminum oxides, in particular corundum, and titanium dioxide, silicon carbide, tungsten carbide, etc. The finely divided, abrasive particles may also be treated superficially or coated in a conventional manner, for example to improve the dispersibility and/or the adhesion in the photopolymerizable and/or photocrosslinkable layer (L).

Advantageously, the abrasive particles employed are substantially permeable to actinic light, and the refractive indices of the particles and of the photopolymerizable and/or photocrosslinkable material used in the layer (L) are matched. In this context, it has proved very advantageous to use silicon dioxides, in particular quartz powder and cristobalite, as abrasive particles.

The abrasive particles may be present throughout the photopolymerizable and/or photocrosslinkable layer (L), and may be uniformly distributed in this layer. To obtain a gravure printing plate having an abrasion-resistant and scratch-resistant printing layer, it has, however, proved sufficient if the abrasive particles are present only in a thin surface zone of the printing layer, and the region below this zone need not contain any abrasive particles. Accordingly, the layer (L) of the photosensitive recording material may contain the abrasive particles only in a thin surface zone of about 1–50, preferably 5–20, μm, thickness, measured from the surface of the layer (L), which subsequently constitutes the surface of the printing layer, and the remaining part of the layer may contain no abrasive particles.

When the particle-containing surface zone of the layer (L) is thicker than 50 μm, or in particular even 20 μm, measured from the surface of the layer (L), which is in general the case when the abrasive particles are uniformly distributed throughout the layer (L), it is advantageous, as mentioned above, or may even be necessary, to employ abrasive particles which are permeable to actinic light, and to match the refractive indices of the abrasive particles and of the photopolymerizable and/or photocrosslinkable material. When the abrasive particles are present only in a surface zone of the layer (L), of from 1 to 50, preferably from 5 to 20, μm thickness, it is also possible to employ light-scattering abrasive particles, without this having a substantial adverse affect on the exposure characteristics of the photosensitive recording material, ie. the refractive indices of the abrasive particles and of the photopolymerizable and/or photocrosslinkable material containing these particles may differ. In this case, the finely divided, abrasive particles may be permeable to actinic light, ie. non-absorbing, or may absorb actinic light. If the photopolymerizable and/or photocrosslinkable material contains finely divided, abrasive particles which are not permeable to actinic light, ie. strongly absorb this light, these particles are advantageously present only in a surface zone of the layer (L), of from 1 to 50, preferably from 5 to 20, μm thickness when the refractive indices of the particles and of the material containing them are matched. If light-scattering and/or light absorbing abrasive particles are employed, it is logical and advantageous to adapt the thickness of the surface zone containing these particles to the extent of the light scattering and light absorption.

The layer (L) contains the abrasive particles in an amount of from 2 to 50, preferably from 5 to 30, % by weight, based on that part of the layer which contains these particles; ie. when the particles are present throughout the layer (L), the percentages are based on the total photopolymerizable and/or photocrosslinkable material, and when the particles are present only in a surface zone of the layer (L), these percentages are based on that part of the photopolymerizable and/or photocrosslinkable material which constitutes the particle-containing surface zone. Suitable photopolymerizable and/or photocrosslinkable materials containing abrasive particles thus essentially comprise in general from 30 to 90% by weight of polymers as the basic component, from 6 to 50% by weight of low molecular weight, olefinically unsaturated, photopolymerizable compounds, from 0.05 to 10, in particular from 0.2 to 5, % by weight of photopolymerization initiators and from 2 to 50, perferably from 5 to 30, % by weight of abrasive particles, with or without conventional amounts of conventional assistants and additives, the percentages being based in each case on the photopolymerizable and/or photocrosslinkable material containing the abrasive particles.

When the abrasive particles are present only in a thin surface zone of the photopolymerizable and/or photocrosslinkable layer (L) of the photosensitive recording material, while the remaining part of the layer is free from abrasive particles, ie. the layer (L) comprises a plurality of strata, it is possible for the individual strata, with the exception of the abrasive particles, to consist of the same photopolymerizable and/or photocrosslinkable material. However, it is also possible for the materials of these strata to differ in respect of the other components, for example in the type and amount of the polymers, the type and amount of low molecular weight, olefinically unsaturated, photopolymerizable compounds, or the type and amount of photopolymerization initiators. Thus, for example, it is particularly advantageous if, in a multi-strata layer (L), the stratum in which the abrasive particles are present contains a mixture of a weakly absorbing and a strongly absorbing photopolymerization initiator, as described above, while the particle-free stratum contains only one or more weakly absorbing initiators. In a multi-strata layer (L), the polymers and low molecular weight, photopolymerizable compounds in the photopolymerizable and/or photocrosslinkable materials of the individual layers are preferably identical, or at least similar and compatible with one another.

The dimensionally stable base for the photopolymerizable and/or photocrosslinkable layer (L) may be the actual printing plate base, or a temporary base which is used, for example, for storage and transportation of the layer (L), and is peeled off from the layer after the latter has been applied to the actual printing plate base. The printing plate base is in general either a steel cylinder or a flat sheet steel support. To achieve good adhesion between the layer (L) and the printing plate base, it is often advantageous to provide the base, before application of the layer (L), with a thin layer of an adhesive, for example one which is based on a polyurethane two-component adhesive, a phenolic resin and/or an epoxy resin. Suitable materials for the temporary base are, in particular, dimensionally stable plastic films which are in general from 50 to 250, in particular from 75 to 150, μm thick. Preferably, the temporary base comprises a polyester film, in particular of polyethylene terephthalate or polybutylene terephthalate.

The novel photosensitive recording materials are conventionally prepared by first mixing the components of the photopolymerizable and/or photocrosslinkable material intimately with one another, and then applying this mixture, as the layer (L), to the dimensionally stable base. These components may be mixed in a conventional manner in solution, in a kneader or in any other mixing apparatus which can mix the components intimately and disperse them very uniformly. If the resulting mixture is a solid, the layer (L) can be formed by extruding, calendering or pressing the photopolymerizable and/or photocrosslinkable material, with simultaneous or subsequent lamination onto the dimensionally stable base. To obtain the desired smooth surface of the layer (L) with a peak-to-valley height of <2 μm, preferably <1 μm, in a simple manner, the layer (L) is preferably produced on the dimensionally stable base by casting from a solution of the photopolymerizable and/or photocrosslinkable material. In this case, of course, the components of the photopolymerizable and/or photocrosslinkable material are advantageously also mixed in solution. Suitable solvents for such solutions, the choice of which solvents also depends on the type and composition of the photopolymerizable and/or photocrosslinkable material, are the solvents which are conventionally used for this purpose, for example alcohols, ethers, esters, ketones, aliphatic halohydrocarbons, aromatic hydrocarbons, etc.

For the photosensitive recording material in which the abrasive particles are present throughout the layer (L), ie. in the case of a single-stratum layer (L), this layer may be applied from solution to the dimensionally stable base in one operation. In the preparation of a multistrata layer (L) in which the abrasive particles are present only in a surface zone of the layer, the stratum containing the abrasive particles and that which is free of the abrasive particles are produced successively in separate steps.

If the layer (L) is produced by casting, spraying or knife-coating a solution of the photopolymerizable and/or photocrosslinkable material directly onto the printing plate base, and a multi-strata layer (L) is to be produced, the solution of the above material which is free of abrasive particles is first applied, the solvent is evaporated, and thereafter the solution of the above material which contains the abrasive particles is applied. To produce a single-stratum layer (L), the solution of the photopolymerizable and/or photocrosslinkable material containing the abrasive particles is applied directly to the printing plate base, which may or may not be provided with an adhesive Layer. The solutions are applied to cylindrical printing plates bases preferably by means of a conventional ring coater, and to flat printing plate bases in particular by a conventional casting or spraying process. The solution of photopolymerizable and/or photocrosslinkable material containing abrasive particles is most advantageously applied to the printing plate base by means of a knife coater in order to obtain, after evaporation of the solvent, a layer (L) having a very smooth surface. In this method of producing the photosensitive recording material, in particular when a cylindrical printing plate base is employed, a very smooth surface of the layer (L): can be obtained by applying, if required, another, very thin stratum, which is not more than 5 μm, preferably from 1 to 3 μm, thick and comprises a photopolymerizable and/or photocrosslinkable material which is free from abrasive particles, to the particle-containing stratum of the layer (L). This outer, thin stratum preferably comprises the same photopolymerizable and/or photocrosslinkable material as the stratum below it, containing the abrasive particles, with the exception, of course, of these particles. We have found that in spite of a thin outer stratum of this type, which is only a few μm thick and free from abrasive particles, the quality, in particular the abrasion-resistance and scratch-resistance, and the usefulness of the gravure printing plates produced from such recording materials are not adversely affected.

Advantageously, the photopolymerizable and/or photocrosslinkable layer (L) is first applied to a temporary base, in particular a polyester film, and subsequently (either before or after exposure) laminated onto the actual printing plate base. This procedure has proven advantageous in particular when flat bases are used to producing printing plates. In this case, as a rule, the surface of the layer (L) which faces away from the temporary base is applied to the printing plate base, so that the surface which faces the temporary base subsequently constitutes the printing surface of the printing plate. To produce a multi-strata layer (L) on a temporary base, the solution of the photopolymerizable and/or photocrosslinkable material containing the abrasive particles is first applied to the temporary base in a conventional manner, for example by casting, roller coating, spraying or knifecoating, and the solvent is evaporated. Thereafter, the solution of the corresponding material which is free from abrasive particles is applied in the same manner to this first stratum of the layer (L). The surface of the temporary base, preferably a polyester film, to which the solution of the particle-containing material is applied should be very smooth, and in particular should possess a peak-to-valley height of less than 2 µm, preferably less than 1 µm. This applies to the production of single-stratum as well as multi-strata layers (L). The surface of the layer (L), which subsequently constitutes the printing surface of the printing layer, thus has the desired smoothness and a low peak-to-valley height, in spite of the content of abrasive particles, this being achieved in a simple manner.

The surface of the photopolymerizable and/or photocrosslinkable layer (L) may be provided, if necessary, with a further thin layer which is not more than about 5 µm, preferably from 1 to 4 µm, thick and permeable to actinic light, but which inhibits the diffusion of oxygen into the layer (L) and hence prevents inhibition of the photopolymerization by oxygen during exposure of the novel photosensitive recording material. Such barrier layers against oxygen are conventionally used in photosensitive recording materials intended for the production of letterpress plates or photoresists, and, in the case of the novel recording materials for the production of abrasion-resistant and scratch-resistant gravure printing plates, may comprise the materials conventionally used for such barrier layers, in particular plastics. The barrier layer against oxygen must be soluble in the developer used for the photopolymerizable and/or photocrosslinkable layer (L), and is washed off together with the unexposed parts of the layer (L) after exposure of the recording material.

The photopolymerizable and/or photocrosslinkable materials for the layer (L) of the novel photosensitive recording material should be chosen so that the printing layer of the resulting gravure printing plate has a Vickers hardness, measured under load, of not less than 10 N/mm², at least to the depth of the depressions which take up the ink. In general, the printing layer is of uniform hardness throughout its thickness, but it is also possible, and adequate, for only a surface region of this layer, to a depth corresponding to that of the wells which take up the ink, to possess the required hardness, while the region below this may be, for example, flexible and resilient. The hardness of the printing layer depends to a lesser extent on the type and amount of abrasive particles than on the polymers employed in the photopolymerizable and/or photocrosslinkable materials, and on the degree of crosslinking in the photopolymerization, ie. the type and amount of monomers, and on the photoinitiator employed. The constitution which the photopolymerization and/or photocrosslinkable material must possess, taking into account the above statements in this connection, for it to have the desired hardness after exposure can be readily determined by a skilled worker by means of a few preliminary experiments. The hardness of the printing layer, or of regions of the printing layer, in particular the surface region, can, if required, be varied and further increased in the exposed and developed printing plate by after-treatment steps, as described in detail below.

The choice of the materials, in particular the choice of the polymers for the photopolymerizable and/or photocrosslinkable materials, is also determined by the field of use of the gravure printing plate, in so far as it is necessary for the printing layer to be resistant to the solvents used for the printing inks. The solvents conventionally used in gravure printing inks are toluene and, to a lesser extent, benzene, ie. low-boiling aliphatic hydrocarbons. However, alcohol-containing, ester-containing, ketone-containing or water-containing printing inks may also be employed. Since the photopolymer printing layers are not equally resistant to all solvents, the choice of the polymers in the photopolymerizable and/or photocrosslinkable materials also depends on the printing ink solvent employed in the gravure printing. In the case of the most commonly used printing inks based on toluene or benzene as the solvent, particularly suitable materials for the production of the gravure printing plates are those which contain, as the polymer in the layer (L), a nylon or nylon copolymer, or a vinyl alcohol polymer or partially hydrolyzed vinyl ester polymer.

To produce the gravure printing plate, the novel photosenitive recording material is irradiated, through a suitable image-bearing transparency, with actinic light, with the result that the exposed areas of the layer (L) photopolymerize and photocrosslink, and thus become insoluble in the developer, while the unexposed areas remain soluble, and can be washed out by the developer.

When the photopolymerizable and/or photocrosslinkable layer (L) is applied to a temporary base, this layer may first be laminated onto the printing plate base, and then exposed. Exposure may be effected either after the temporary base has been peeled off from the layer (L), or through the temporary base, which is then peeled off only after the exposure. However, the layer (L) on the temporary base may also be exposed before being laminated onto the printing plate base.

The photosensitive recording materials are exposed using light sources capable of emitting actinic light having a wavelength of in general from 250 to 750 nm, preferably from 300 to 500 nm, and emission maxima in general in the region of the absorption of the photoinitiators. For the production, in accordance with the invention, of the gravure printing plates, the light sources conventionally used in reproduction work may be employed, for example carbon-arc lamps, actinic or superactinic fluorescent tubes, low-pressure, medium-pressure and high-pressure mercury vapor lamps which may be doped, and xenon lamps or lasers with a substantial UV component, eg. argon ion lasers with UV outputs of from 1 to 2 watts. Exposure may be carried out in a conventional vacuum frame (in the case of plates or films), or in a commercial rotary or cylindrical exposure unit (in the case of cylinders). The image-bearing transparency used for the exposure may be a customary halftone or line positive, or a continuous tone positive in combination with a screen grid.

The exact exposure time depends on the type of material used for the photopolymerizable and/or photocrosslinkable layer (L), is usually from 0.5 to 10 minutes, and may be readily determined for the particular layer material by a few preliminary experiments. The exposure time should, in particular, be sufficiently long for the particle-containing surface zone of the layer (L) to be completely polymerized and crosslinked, and no longer attacked by the developer, in the subsequent washout. The washout or development of the imagewise-exposed recording material to remove the unexposed, and hence still soluble, areas of the layer, thus forming the grid and well structure of the gravure printing plate, is effected in a conventional manner, by treating the exposed recording materials with the developer, for example in a developer bath, a spray washer or a brush washer, or in another suitable manner.

Developers may be chosen from those solvents or solvent mixtures in which the unexposed photopolymerizable and/or photocrosslinkable material is readily soluble or at least readily dispersible, but the exposed, photopolymerized material is no longer soluble or dispersible. The choice of suitable developers depends on the composition of the photopolymerizable and/or photocrosslinkable material, in particular on the type of polymers present therein. Preferably, the developers chosen do not pollute the environment and are easy to handle, ie. may be handled without employing special safety measures, and may be simply and readily purified and worked up. Examples of developers are lower aliphatic alcohols, mixtures of alcohols with water, glycol ethers, glycol esters, aqueous or alcoholic caustic alkali solutions, dilute aqueous acids, and water. For example, water or aqueous, alkaline solutions are suitable developers for photopolymerizable and/or photocrosslinkable materials based on vinyl alcohol polymers or unsaturated polyester resins, while lower aliphatic alcohols, in particular mixtures of such alcohols with water, for example mixtures of ethanol with water in the ratio 8:2, have proved to be useful developers for the corresponding materials based on nylon copolymers.

The treatment of the exposed gravure printing plate with developer, ie. the process of washing out unexposed areas, is preferably carried out at a temperature at which the washout process is complete in a very short time, ie. within about 1–10 minutes, but without the exposed areas of the photopolymer plate being attacked by the developer. For most developers, washout is advntageously carried out at from 10° C. to 40° C. Even though the developers chosen are preferably solvents or solvent mixtures which attack the exposed, insoluble areas only to a small extent, if at all, these developers in general also diffuse into the insoluble areas of the photopolymerized material, so that it is advisable to remove this residual solvent by means of a short drying process carried out subsequently to the washout process. Drying may be carried out at room temperature or above, for example at from 50° C. to 120° C., and is assisted by effective air circulation, for example by means of a blower, a fan, or the like. Drying at an elevated temperature has the additional advantage that it may also increase the hardness of the printing layer.

In some cases, in particular when the printing layer of the gravure printing plate contains, as the basic component, nylons, nylon copolymers or vinyl alcohol polymers, it has proved advantageous to subject the plate to an additional hardening process after it has been dried by heating it for a short time at from 200° C. to about 260° C., preferably from 220° to 240° C. In general, from 5 to 60 minutes is sufficiently long for this afterhardening at a high temperature, but longer times may also be employed. In this subsequent hardening, the photopolymer layer is baked, and its Vickers hardness, measured under load, increases to above 200 N/mm$^2$. An accompanying change in the color of the layer to pale brown or dark brown has no adverse affect on either its mechanical properties or its printing characteristics.

Furthermore, it has proved advantageous in some cases to after-expose the whole surface of the novel gravure printing plate after it has been washed out and dried. This after-exposure, in which the photopolymerization and/or photocrosslinking in the printing layer are completed, is particularly advisable when the plate has been produced using photosensitive recording materials which contain strongly light-absorbing photoinitiators, eg. Michler's ketone or derivatives thereof, in the photopolymerizable and/or photocrosslinkable layer (L).

The gravure printing plate produced according to the invention may furthermore be so structured that the photopolymer printing layer is not applied directly to the printing plate base, but is bonded firmly to the latter via one or more intermediate layers. Such intermediate layers are in general composed of plastic material which is not photopolymerizable and/or photocrosslinkable, can be firmly bonded to the layer (L) and to the printing plate base, and is insoluble in the developers. These intermediate layers may comprise the same materials as those used for the photopolymerizable and/or photocrosslinkable layer (L), or similar materials. It may be useful, in particular when the plate is subjected to peak loads, or in the case of plates having a wide tolerance on surface waviness, if the intermediate layer is soft and resilient.

The plates produced according to the invention may be employed in the conventional gravure printing presses, and give printed copies which, depending on the technique used and on the type of photopolymerizabvle and/or photocrosslinkable material employed, are identical with the results achieved with conventional gravure printing plates. A substantial advantage of the novel gravure printing plates compared to a conventional plate possessing a Ballard skin is that they may be simply and rapidly produced, without being inferior to the conventional plates as regards their printing characteristics. In particular, the gravure printing plates produced according to the invention possess high abrasion-resistance and scratch-resistance in comparison to the conventional plates having plastic printing layers, so that it is possible, using the novel plates, to obtain from 500,000 to 1,000,000 copies of constantly good quality, in particular as regards continuous-tone reproduction. Another feature to be particularly singled out is that when gravure printing is carried out using the plates produced according to the invention, the conventional steel doctor blades may be employed, without in any way causing damage to the printing layer or the steel doctor blades, in contrast to the conventional gravure printing plates with plastic printing layers. When the novel plates are employed, the steel doctor blades are uniformly worn away by the surface of the photopolymer printing layer, in the same way as in the case of a conventional gravure printing plate with a Ballard skin. Flexible steel doctor blades having rounded beveled edges and a surface hardness of not less than 350 (Vickers hardness according to DIN 50,133), as described in German Laid-Open Application DOS No. 3,110,842, may be particularly advantageously used in gravure printing with the novel plates. If the gravure printing plates produced according to the invention are damaged during use, for example by defective doctor blades or the like, and exhibit scratches, grooves or striae, they may be polished smooth, in the same manner as a conventional gravure printing plate with a Ballard skin. As a result of this special, advantageous property, which was in no way to be expected, the useful life of the novel plate can be prolonged substantially.

The Examples which follow illustrate the invention. Parts are by weight, unless stated otherwise. For the purposes of this invention, the peak-to-valley height is determined according to DIN 4,762. The Vickers hardness under load is determined by the method described in Kunststoffe, 60 (1970), 265–273. This method is an adaptation of the Vickers hardness test prescribed in DIN 50,133 for the determination of the hardness of plastics.

EXAMPLE 1

A 200 μm thick photopolymerizable layer, comprising an intimate mixture of 54 parts of a nylon copolymer which is soluble in aqueous alcohol and contains about equal amounts of hexamethylenediamine adipate, 4,4′-diaminodicyclohexylmethane adipate and ε-caprolactam, 24 parts of the diether obtained from 1 mole of ethylene glycol and 2 moles of N-methylolacrylamide, 2 parts of benzyl dimethyl ketal and 20 parts of quartz powder (F 600 from Quarzwerke Frechen), was applied to a 240 μm thick steel sheet provided with a polyurethane adhesive layer. The photopolymerizable layer was exposed through an intaglio halftone image-bearing transparency, the parts of the layer which were still soluble were washed out with an ethanol/water mixture, and the resulting gravure printing plate was dried for 30 minutes at 80° C. The Vickers hardness, measured under load, was 15 N/mm$^2$.

The printing plate was tested in an abraser (Model AT II from Burda). After one million passages of the doctor blade, the plate was completely undamaged, and the doctor blade exhibited slight, uniform abrasion. Furthermore, a printing plate produced in this manner was used for rotogravure printing. After 500,000 cylinder revolutions, the printing plate was still undamaged, and the prints obtained were of high quality.

COMPARATIVE EXAMPLE A

A gravure printing plate was prepared as described in Example 1, but the photopolymerizable layer comprised, before exposure, an intimate mixture of the following composition: 68 parts of the nylon copolymer used in Example 1, 30 parts of the diether obtained from 1 mole of ethylene glycol and 2 moles of N-methylolacrylamide, and 2 parts of benzyl dimethyl ketal. The plate was exposed, washed out and dried as described in Example 1, and its Vickers hardness, measured under load, was 15 N/mm$^2$. The plate was tested in an abraser (Model AT II from Burda). After 50,000 passages of the doctor blade, the plate exhibited deep scratches and a decrease in the well volume. The doctor blade was extensively damaged. When the plate was subjected to a printing test in a printing press (Albert, Frankenthal), streaks were observed in the print after 4,000 cylinder revolutions, and it was possible to observe a substantial decrease in the tone density, owing to the lower well volume, after 40,000 cylinder revolutions.

COMPARATIVE EXAMPLE B

A gravure printing plate was produced as described in Example 1, but the quartz powder in the photopolymerizable layer was replaced by 20 parts of fine talc powder. When the plate was tested in an abraser (Model AT II from Burda), both the plate and the doctor blade were found to be extensively damaged after 50,000 passages of the doctor blade.

EXAMPLE 2

A gravure printing plate was produced by applying a 200 μm thick, photopolymerizable layer of the following composition to a 240 μm thick steel plate provided with an adhesive layer of polyurethanes: 48 parts of a partially hydrolyzed polyvinyl acetate (degree of hydrolysis 82 mole%, degree of polymerization 500), 30 parts of hydroxyethyl methacrylate, 2 parts of benzyl dimethyl ketal and 20 parts of quartz powder (F 600 from Quarzwerke Frechen). The photopolymerizable layer was exposed through an intaglio halftone image-bearing transparency, the parts of the layer which were still soluble were then washed out with water, and the resulting plate was dried for 30 minutes at 80° C. The plate had a Vickers hardness, measured under load, of 40 N/mm$^2$.

The printing plate was tested in an abraser (Model AT II from Burda). After one million passages of the doctor blade, the printing plate remained completely undamaged, and the doctor blade exhibited slight, uniform abrasion.

COMPARATIVE EXAMPLE C

A gravure printing plate was produced as described in Example 2, except that the photopolymerizable layer had the following composition: 60 parts of a partially hydrolyzed polyvinyl acetate (degree of hydrolysis 82 mole%, degree of polymerization 500), 38 parts of hydroxyethyl methacrylate and 2 parts of benzyl dimethyl ketal. The plate was exposed, washed out and dried as described in Example 2, and was tested in an abraser (Model AT II). After about 50,000 passages of the doctor blade, the plate exhibited deep scratches and a substantial decrease in the well volume. The doctor blade exhibited very uneven wear.

EXAMPLE 3

A gravure printing plate was produced as described in Example 1, except that, after drying, it was heated for 15 minutes at 120° C., with simultaneous irradiation with UV light, and thereafter hardened for 10 minutes at 250° C. Thereafter, the plate had a Vickers hardness, measured under load, of 200 N/mm$^2$. After one million passages of the doctor blade, in an abraser (AT II), the plate remained completely undamaged. Excellent printed copies were obtained in a printing test.

EXAMPLE 4

A gravure printing plate was produced as described in Example 2, except that, after drying, it was subjected heated for 15 minutes at 120° C., with simultaneous irradiation with UV light, and then after-hardened for 10 minutes at 250° C. The plate had a Vickers hardness, measured under load, of 250N/mm². After one million passages of the doctor blade, in an abraser (AT II), the plate showed no signs of damage, and produced excellent printed copies.

EXAMPLE 5

A 200 μm thick photocrosslinkable layer of the following composition was applied to a 240 μm thick steel plate provided with an adhesive layer of polyurethanes: 54 parts of the nylon described in Example 1, 24 parts of the diether obtained from 1 mole of ethylene glycol and 2 moles of N-methylolacrylamide, 2 parts of benzyl dimethyl ketone, 0.2 part of Michler's ketone and 20 parts of quartz powder (F 600 from Qaurzwerke Frechen). This photosensitive material was exposed, washed out and dried, as described in Example 1. The resulting gravure printing plate had a greater resistance to the alcoholic washout solution and a greater surface gloss than the plate produced as described in Example 1.

EXAMPLE 6

A gravure printing plate was produced as described in Example 1, but the photopolymerizable layer had the following composition before exposure: 65 parts of the nylon described in Example 1, 28 parts of the diether obtained from 1 mole of ethylene glycol and 2 moles of N-methylolacrylamide, 2 parts of benzyl dimethyl ketal and 5 parts of the quartz powder described in Example 1. The resulting gravure printing plate remained completely undamaged after one million passages of the doctor blade, in an abraser (Model AT II from Burda).

EXAMPLE 7

A gravure printing plate was produced as described in Example 5, but the 20 parts of quartz powder were replaced by 20 parts of cristobalite powder (Quarzwerke Frechen). The printing plate had a glossy surface, and remained undamaged after one million passages of the doctor blade, in an abraser (Model AT II).

EXAMPLE 8

A solution of 100 parts of the photopolymerizable material described in Example 1, but with the quartz powder replaced in this case by 20 parts of aluminum oxide, in 50 parts of methanol was cast onto a 125 μm thick polyester film in a thickness such that the photopolymerizable layer possessed a thickness of 50 μm after the solvent had been evaporated off. Thereafter, the photopolymerizable layer was laminated onto a steel plate provided with an adhesive layer of polyurethanes, the polyester film was peeled off from the photopolymerizable layer, and a gravure printing plate as described in Example 1 was produced by exposure through an intaglio halftone image-bearing transparency, washing out and drying. When the plate was tested in an abraser (Model AT II from Burda), neither the plate nor the doctor blade exhibited any signs of damage after 500,000 passages of the doctor blade.

We claim:

1. A process for the production of a gravure printing plate, which comprises exposing a photopolymerizable and/or photocrosslinkable layer (L), which is applied to a dimensionally stable base and consists of a photosensitive recording material, to actinic light through a halftone or line positive or through a continuous tone positive and a screen grid, washing out the non-exposed areas of the layer by means of a developer in which these areas, but not the exposed areas, of this layer are soluble or dispersible, and drying the resulting gravure printing plate, wherein the photopolymerizable and/or photocrosslinkable layer (L) contains, at least in a surface zone having a thickness of from 1 to 50 μm, measured from the surface of the layer (L), which subsequently constitutes the surface of the printing plate, finely-divided, abrasive particles in an amount of from 2 to 50% by weight, based on the photopolymerizable and/or photocrosslinkable layer (L) containing these particles, the mean particle size being from 0.1 to 6 μm, not more than 5% of these particles have a maximum particle size greater than 10 μm, the particles have a hardness of >4.0 on Mohs' hardness scale, the surface of the layer (L) has a peak-to-valley height of <2 μm, and the components of the layer (L) are chosen so that this layer, after exposure, development and drying, has a Vickers hardness, measured under load, of not less than 10 N/mm², at least to the thickness of the wells which take up the ink.

2. A process as claimed in claim 1, wherein the finely divided, abrasive particles present in the photopolymerizable and/or photocrosslinkable layer (L) are permeable to actinic light, and the refractive indices of these particles and of the photopolymerizable and/or photocrosslinkable material containing these particles are substantially the same.

3. A process as claimed in claim 1, wherein the refractive indices of the finely divided, abrasive particles and of the photopolymerizable and/or photocrosslinkable material containing these particles are substantially the same, and these particles strongly absorb actinic light and are present in the layer (L) only to a depth of from 1 to 50 μm, measured from the surface of the layer (L), which subsequently constitutes the surface of the printing plate.

4. A process as claimed in claim 1, wherein the refractive indices of the finely divided, abrasive particles and of the photopolymerizable and/or photocrosslinkable material containing these particles are different, and the finely divided, abrasive particles which may or may not absorb actinic light are present in the layer (L) only to a depth of from 1 to 50 μm, measured from the surface of the layer (L), which subsequently constitutes the surface of the printing plate.

5. A process as claimed in claim 1, wherein the photopolymerizable and/or photocrosslinkable layer (L) contains, at least in the zone of the layer (L) which contains the abrasive particles, a weakly absorbing photopolymerization initiator with an extinction coefficient ϵ of <350 cm²/millimole at 360 nm as well as a strongly absorbing photopolymerization initiator with an extinction coefficient ϵ of more than 500 cm²/millimole at 360 nm.

6. A process as claimed in claim 1, wherein the photopolymerizable and/or photocrosslinkable layer (L) is first applied to a polyester film as a temporary base, the layer is laminated, before or after exposure, onto the actual printing plate base, and the polyester film is then peeled off, this last step being carried out before washout with the developer.

7. A process as claimed in claim 1, wherein the whole surface of the gravure printing plate is after-exposed to actinic light, after the plate has been washed out and dried.

8. A process as set forth in claim 3, wherein the finely-divided, abrasive particles are present in the layer (L)

only to a depth of from 5 to 20 μm, measured from the surface of the layer (L), which subsequently forms the surface of the printing plate.

9. A process as set forth in claim 4, wherein the finely-divided, abrasive particles are present in the layer (L) only to a depth of from 5 to 20 μm, measured from the surface of the layer (L), which subsequently forms the surface of the printing plate.

10. A process as set forth in claim 1, wherein the gravure printing plate is after-hardened at from 200° C. to about 260° C., after the unexposed areas have been washed out and the plate dried.

11. A process as set forth in claim 7, wherein the gravure printing plate is after-hardened at from 200° C. to 260° C., after the unexposed areas have been washed out and the plate dried, and after the whole surface of the plate has been after-exposed.

* * * * *